(12) United States Patent
Graumann et al.

(10) Patent No.: US 10,700,713 B2
(45) Date of Patent: Jun. 30, 2020

(54) SYSTEM AND METHOD FOR ERROR CORRECTION IN DATA COMMUNICATIONS

(71) Applicant: Microsemi Storage Solutions, Inc., Aliso Viejo, CA (US)

(72) Inventors: Peter Graumann, Calgary (CA); Saeed Fouladi Fard, Calgary (CA)

(73) Assignee: MICROSEMI STORAGE SOLUTIONS, INC., Aliso Viejo, CA (US)

(*) Notice: Subject to any disclaimer, the term of this patent is extended or adjusted under 35 U.S.C. 154(b) by 56 days.

(21) Appl. No.: 16/044,139

(22) Filed: Jul. 24, 2018

(65) Prior Publication Data

US 2019/0044539 A1   Feb. 7, 2019

Related U.S. Application Data

(60) Provisional application No. 62/539,974, filed on Aug. 1, 2017.

(51) Int. Cl.
*H03M 13/29* (2006.01)
*H03M 13/11* (2006.01)
*H03M 13/25* (2006.01)

(52) U.S. Cl.
CPC ... *H03M 13/2942* (2013.01); *H03M 13/1108* (2013.01); *H03M 13/1148* (2013.01); *H03M 13/255* (2013.01); *H03M 13/2909* (2013.01)

(58) Field of Classification Search
CPC ................. H03M 13/2942; H03M 13/2909
See application file for complete search history.

(56) References Cited

U.S. PATENT DOCUMENTS

| | | | | |
|---|---|---|---|---|
| 6,625,774 B1* | 9/2003 | Yang | ..................... | H03M 13/09 714/755 |
| 6,675,318 B1* | 1/2004 | Lee | ..................... | G06F 11/1076 714/6.21 |
| 6,757,862 B1* | 6/2004 | Marianetti, II | ....... | H03M 13/05 714/759 |
| 2004/0117723 A1* | 6/2004 | Foss | ..................... | G06F 11/1044 714/805 |
| 2009/0168904 A1* | 7/2009 | Roh | ..................... | H03M 13/05 375/253 |
| 2014/0108881 A1* | 4/2014 | Blaum | .............. | H03M 13/2909 714/755 |

* cited by examiner

*Primary Examiner* — Joseph D Torres
(74) *Attorney, Agent, or Firm* — Leber IP Law; David C. Robertson

(57) ABSTRACT

A method and system are provided for error correction. After row encoding and column encoding, additional codeword data (ACD) and modified parity (P') may be concurrently created, for each of a plurality of modified column codewords (CCW'), by multiplying initial calculated parity P by a generator matrix G. Each CCW' may include an ACD portion and a P' portion such that each bit in the P' portion of a selected CCW' is present in the ACD portion for one of the other CCW'. In contrast to known approaches, the method and system may provide modified column codewords such that all data and parity bits are present in two codewords while using only two types of codewords, and without using extra parity-on-parity bits. In a set of modified column codewords, each bit in the modified parity in one modified codeword is present in another codeword.

20 Claims, 12 Drawing Sheets

SYSTEM AND METHOD FOR ERROR CORRECTION IN DATA COMMUNICATIONS

This application claims the benefit of priority of U.S. Patent Application Ser. No. 62/539,974, filed on Aug. 1, 2017, the contents of which is hereby incorporated by reference.

FIELD

The present disclosure relates generally to the field of data communications. More particularly, the present disclosure relates to a system and method for error correction.

BACKGROUND

Data communications systems can employ encoding and decoding to enhance security of the transmitted data. Such systems can also employ error detection and error correction to enhance reliability of transmitted data, for example to compensate for unreliability in the communication channel. Some systems employ hard decoding, which means deciding the value to assign for each input on a stand-alone basis, or soft decoding, which takes into account the reliability of each data point, or a combination of the two. Parity bits are often added to transmitted data and used as an error detecting code.

Forward error correction (FEC), or channel coding, is one approach for combining encoding with error correction by using an error-correcting code (ECC). Examples of ECCs include cyclic ECCs, such as BCH (Bose-Chaudhuri-Hocquenghem) codes. Depending on implementation details, a certain number of parity bits can correct for a maximum number of errors in the transmitted data.

FIG. 1 illustrates a known approach to row and column codeword encoding. FIG. 1 shows a common product code construction including row codewords, column codewords, and additional parity-on-parity (POP) codewords. Raw data is provided for encoding, the raw data being divided into R rows, where R is a positive integer. Typically, the R rows of raw data 10 are encoded first, for example by row encoding, creating computed row parity 12. The row parity 12 is created separately for each row of raw data. A row codeword 14 includes one row of the raw data 10 and the corresponding computed row parity 12. The plurality of row codewords 14 can be described as together defining column data 20 arranged in a plurality of columns. The column data 20 can be referred to as input data, or initial column codeword data (ICD), since it is provided as input data to the column encoding. As shown in FIG. 1, the ICD for each column comprises raw data 10, computed row parity 12, or a combination of the two.

Column encoding is performed on the ICD 20 creating column parity P 22. For example, the column parity 22 for column 1 is shown as P1. The column data 20 and column parity 22 in each column together form a column codeword 24. At this stage, each bit of row data 10 and row parity 12 is part of two codewords: a row codeword and a column codeword. After the row and column encoding, the rows of raw data 10 and the row parity 12 are "double-covered", or present in two codewords, but the column parity 22 is not double-covered.

According to the known approach in FIG. 1, to double-cover the column parity 22, after the row codewords 14 and column codewords 24 have been created, the column parity 22 is further encoded to create parity-on-parity (POP) values 32. A POP codeword 34 is a row-like codeword that comprises all of the column parity 22 associated with the selected "row" and the corresponding POP values 32.

However, the known approach as described in relation to FIG. 1 has the following drawbacks: 1) the extra POP values that help double cover the column parity result in wasted parity space, which lowers the code rate; 2) the computed POP values themselves are only single covered, or present in a single codeword, which results in reduced error correction performance; and 3) there are 3 types of codewords to work with: row codewords, column codewords and parity-on-parity codewords, which results in a higher implementation complexity.

While existing error-correcting codes offer advantages such as very good error correction performance, this can come at the expense of high power consumption, long decode times, high encoder/decoder complexity, and/or high encoder/decoder implementation area. In certain implementations, these drawbacks are significant enough that the ECC cannot be employed.

Improvements in error correction approaches are desirable.

DETAILED DESCRIPTION

Figure 1:
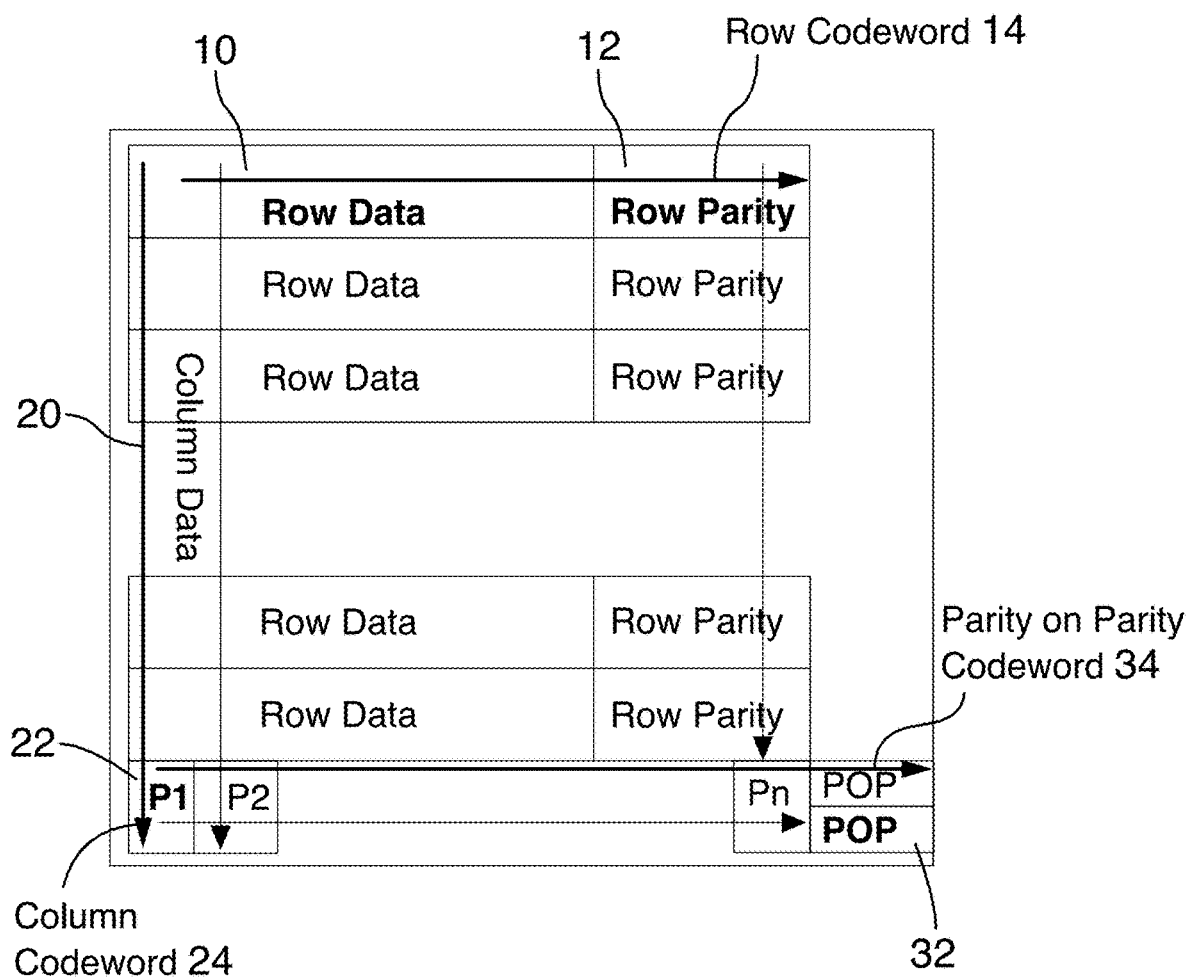
FIG. 1 illustrates a known approach to row and column codeword encoding.

A method and system are provided for error correction. In an implementation, after row encoding and column encoding, additional codeword data (ACD) and modified parity (P') are concurrently created, for each of a plurality of modified column codewords (CCW'), by multiplying initial calculated parity P by a generator matrix G. In an example implementation, each CCW' includes an ACD portion and a P' portion such that each bit in the P' portion of a selected CCW' is present in the ACD portion for one of the other CCW'. In contrast to known approaches, in an implementation the method and system described herein provide modified column codewords such that all data and parity bits are present in two codewords while using only two types of codewords, and without using extra parity-on-parity bits. In a set of modified column codewords generated according to the method and system described herein, each bit in the modified parity in one modified codeword is present in another codeword.

A product code is an array of block codes built from smaller code word blocks. It is desirable for a product code to have all bits "double-covered", or present in two codewords, to enhance error correction capabilities.

Encoding initial data, such as by row encoding or column encoding, creates a set of parity bits referred to as initial parity P. For example, column encoding initial column codeword data ICD produces the initial column parity P. In another example, column encoding a first column of the initial data produces computed initial parity P1. A parity matrix is a matrix comprising a set of parity bits for each of a plurality N of columns, e.g. {P1, ..., PN}, where N is a positive integer.

A column codeword (CCW), or constituent codeword, comprises the initial data and the initial parity produced using known column encoding.

A modified column codeword (CCW') is generated according to an embodiment of the present disclosure based on the initial parity P. Each CCW' includes an additional column codeword data (ACD) portion and a modified parity (P') portion.

In an example embodiment, for each of N modified column codewords, ACD and P' are concurrently created by multiplying the initial parity P by a generator matrix G (to be defined later) such that each bit in the P' portion for a selected CCW' is present in the ACD portion for one of the other N−1 CCW'.

A modified parity matrix comprises a set of modified parity bits P' for each of a plurality N of columns, e.g. {P1', ..., PN'}.

A generator matrix is a matrix by which the initial parity P is multiplied to produce the modified parity P' and the additional column codeword data ACD. In an embodiment, the generator matrix is the matrix inversion of a parity connection matrix, where the parity connection matrix is a matrix made up of 1s and 0s, where a 1 value represents a valid connection and a 0 represents a lack of connection. For example, in an embodiment, the parity connection matrix is a matrix defining relationships, or connections, between the initial parity (P), the modified column codewords (CCW'), the modified parity (P'), and the additional column data (ACD). In defining the relationship between the initial parity P and the modified parity P', the parity connection matrix also includes all ACD connections.

In an aspect, the present disclosure provides a non-transitory computer-readable memory storing statements and instructions for execution by a processor to perform a method of encoding data, the processor-implemented method comprising: row encoding R rows of raw data to create row parity for each of the R rows, and storing the row parity in a memory; creating a plurality R of row codewords comprising the R rows of raw data and the created row parity, the plurality of row codewords defining initial column codeword data (ICD) arranged in N columns; column encoding the initial column data ICD into a plurality N of initial column codewords, each of the plurality N of initial column codewords having a portion of the ICD and having a computed initial parity P; concurrently creating, for each of N modified column codewords (CCW), additional column codeword data (ACD) and modified parity (P') by multiplying the initial parity P by a generator matrix G, each CCW including an ACD portion and a P' portion such that each bit in the P' portion of a selected CCW is present in the ACD portion for one of the other N−1 CCW'; storing the modified parity for the N columns in a modified parity memory; and transmitting a forward error correction (FEC) block, the FEC block comprising the plurality of row codewords and the modified parity for the N columns.

In an example embodiment, the P' portions for all N columns together form a set of modified parity bits {P1', ..., PN'}, wherein the ACD portions for all N columns together form a set of ACD {$ACD_1$, ..., $ACD_N$}, and wherein all of the modified parity bits are present in {$ACD_1$, ..., $ACD_N$}. In an example embodiment, each of the modified parity bits in the set is present only once in the set {$ACD_1$, ..., $ACD_N$}.

In an example embodiment, in the method, concurrently creating the ACD and the P' for each of the N CCW' comprises deriving part of the ACD portion for a selected CCW based on contents of the P' portion from the remaining N−1 CCW', or from each of the remaining N−1 CCW'.

In an example embodiment, the generator matrix has a size N×N and the method further comprises: generating an initial parity matrix having 1 column and N rows and including the computed initial parity P for the plurality N columns; and creating the modified parity P' by multiplying the initial 1×N parity matrix by the generator matrix of size N×N, the modified parity provided in a modified parity matrix having N columns and 1 row.

In an example embodiment, the generator matrix defines connection relationships between the initial parity P and the modified parity P' and the ACD for each of the N columns, the connection relationships causing each bit in P' for a selected CCW to be present in the ACD for one of the other N−1 CCW'.

In an example embodiment, the generator matrix comprises a plurality of cyclically symmetrical rows such that each row of the generator matrix is a cyclically rotated version of an adjacent row. In an example embodiment, an N×N generator matrix is stored in 1/N of the space by storing content of only one row and an indication of how each row is a cyclically rotated version of the stored row.

In another aspect, the present disclosure provides a non-transitory computer-readable memory storing statements and instructions for execution by a processor to perform a method of encoding data, the processor-implemented method comprising: obtaining initial codeword data ICD; encoding the ICD into a plurality N of initial codewords (CW), each of the plurality N of initial codewords having a portion of the ICD and having a computed initial parity P; creating a plurality N of modified codewords (CW') by multiplying the initial parity P by a generator matrix G to concurrently create, for each of the N modified codewords, additional codeword data (ACD) and modified parity (P') such that each bit in the P' for a selected CW is present in the ACD for one of the other N−1 CW; storing the modified parity for the N modified codewords in a modified parity memory; and transmitting a forward error correction (FEC)

block, the FEC block comprising the ICD and the modified parity for the N modified codewords.

In an example embodiment, the P' portions for all N columns together form a set of modified parity bits $\{P1', \ldots, PN'\}$, wherein the ICD portions for all N columns together form a set of ICD $\{ICD_1, \ldots, ICD_N\}$, and wherein all of the modified parity bits $\{P1', \ldots, PN'\}$ are present in $\{ICD_1, \ldots, ICD_N\}$. In an example embodiment, each of the modified parity bits in the set $\{P1', \ldots, PN'\}$ is present only once in the set $\{ICD_1, \ldots, ICD_N\}$. In an example embodiment, the generator matrix comprises a plurality of cyclically symmetrical rows such that each row of the generator matrix is a cyclically rotated version of an adjacent row.

In a further aspect, the present disclosure provides an encoder comprising: a processor; a parity memory in communication with the processor; a first encoder memory storing a generator matrix; and a second encoder memory, in communication with the parity memory and the first encoder memory and the processor. The second encoder memory stores statements and instructions for execution by the processor to perform a method of encoding data, the method comprising: storing, in the parity memory in a first memory state, a plurality R of row codewords comprising R rows of raw data and created row parity, the plurality of row codewords defining initial column codeword data ICD arranged in N columns; column encoding the initial column data ICD into a plurality N of initial column codewords, and storing, in the parity memory in a second memory state, the plurality N of initial column codewords, each of the plurality N of initial column codewords having a portion of the ICD and having a computed initial parity P; concurrently creating for each of the N modified column codewords (CCW), additional column codeword data (ACD) and modified parity (P') by multiplying the initial parity P by a generator matrix G, each CCW including an ACD portion and a P' portion such that each bit in the P' portion for a selected CCW' is present in the ACD portion for one of the other N-1 CCW'; storing, in the parity memory in a third memory state, the ACD and the P' for each CCW'; storing, in the parity memory in a fourth memory state, the modified parity P' for the N columns; and transmitting a forward error correction (FEC) block, the FEC block comprising the plurality of row codewords and the modified parity P' for the N columns stored in the parity memory in the fourth memory state.

In an example embodiment, the generator matrix defines connection relationships between the initial parity P and the modified parity P' and the ACD for each of the N columns, the connection relationships causing each bit in P' for a selected CCW' to be present in the ACD for one of the other N-1 CCW'.

In an example embodiment, the generator matrix comprises a plurality of cyclically symmetrical rows such that each row of the generator matrix is a cyclically rotated version of an adjacent row.

In an example embodiment, an N×N generator matrix is stored in 1/N of the space by storing content of only one row and an indication of how each row is a cyclically rotated version of the stored row.

In another aspect, the present disclosure provides a processor-implemented method of encoding data, comprising: storing, in a memory in a first memory state, a plurality R of row codewords comprising R rows of raw data and created row parity, the plurality of row codewords defining initial column codeword data ICD arranged in N columns; column encoding the initial column data ICD into a plurality N of initial column codewords, and storing, in the memory in a second memory state, the plurality N of initial column codewords, each of the plurality N of initial column codewords having a portion of the ICD and having a computed initial parity P; concurrently creating for each of the N modified column codewords (CCW'), additional column codeword data (ACD) and modified parity (P') by multiplying the initial parity P by a generator matrix G, each CCW' including an ACD portion and a P' portion such that each bit in the P' portion for a selected CCW' is present in the ACD portion for one of the other N-1 CCW'; storing, in the parity memory in a third memory state, the ACD and the P' for each CCW'; storing, in the parity memory in a fourth memory state, the modified parity P' for the N columns; and transmitting a forward error correction (FEC) block, the FEC block comprising the plurality of row codewords and the modified parity P' for the N columns stored in the parity memory in the fourth memory state.

In an example embodiment, the P' portions for all N columns together form a set of modified parity bits $\{P1', \ldots, PN'\}$, wherein the ACD portions for all N columns together form a set of ACD $\{ACD_1, \ldots, ACD_N\}$, and wherein all of the modified parity bits $\{P1', \ldots, PN'\}$ are present in $\{ACD_1, \ldots, ACD_N\}$.

In an example embodiment, the generator matrix comprises a plurality of cyclically symmetrical rows such that each row of the generator matrix is a cyclically rotated version of an adjacent row.

Other aspects and features of the present disclosure will become apparent to those ordinarily skilled in the art upon review of the following description of specific embodiments in conjunction with the accompanying figures.

Figure 2:
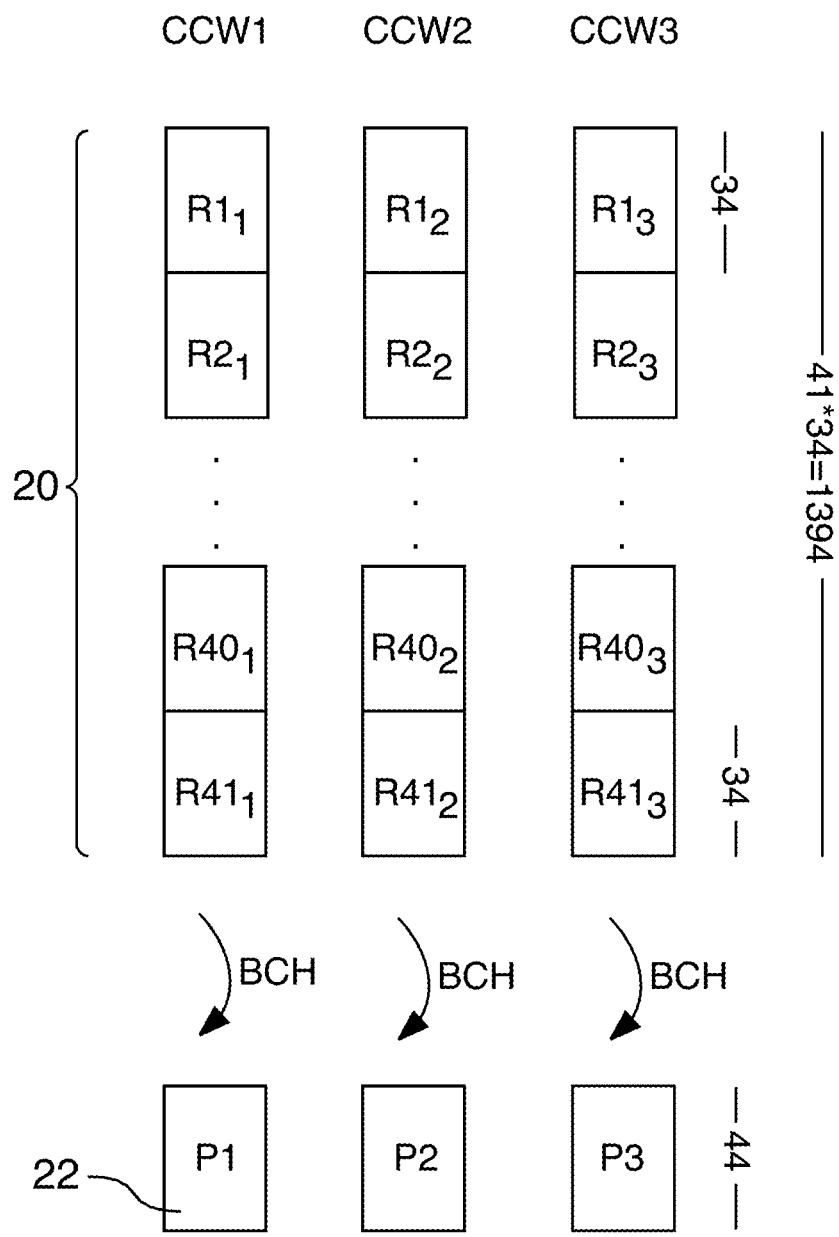
FIG. 2 illustrates in further detail the known column encoding of FIG. 1.

FIG. 2 illustrates in further detail an example embodiment of the known column encoding of FIG. 1. In the example embodiment of FIG. 2, which includes 41 rows of data, the first column codeword CCW1 is shown to include first components $R1_1, R2_1, \ldots, R41_1$ from each of rows 1-41, forming the column data 20, which is also the initial column codeword data ICD. The first column parity P1 of the first column codeword CCW1 is created by encoding, using a known column encoding method, such as BCH encoding, the first column of the ICD. To generalize, for a column encoding method using i rows and j codewords, each column codeword $CCW_j$ includes the $j^{th}$ components $R1_j, R2_j, \ldots, Ri_j$ of the ICD. In the example of FIG. 2, the 41 rows are each 34 bits in length, resulting in a data portion of the CCW of 41*34=1,394 bits, and a corresponding column parity of 44 bits.

Figure 3:
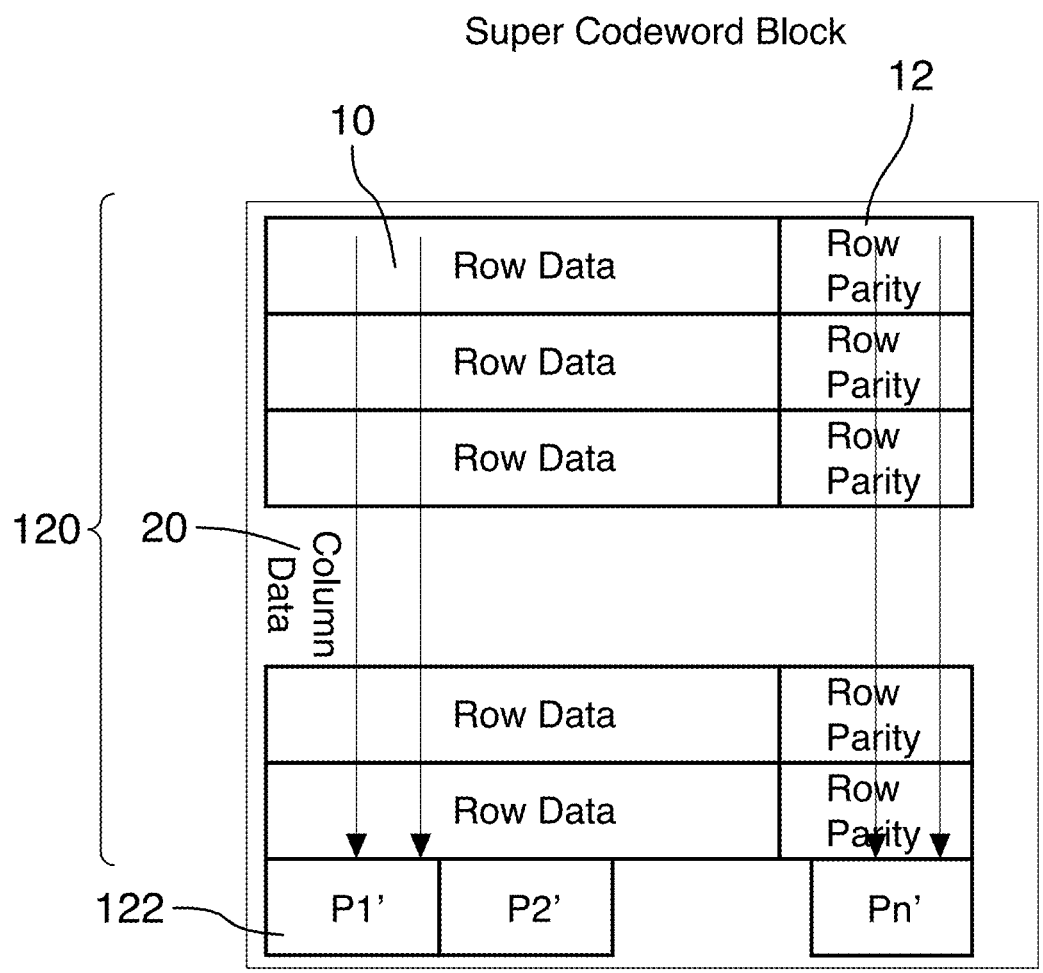
FIG. 3 illustrates row and column codeword encoding using modified parity according to an embodiment of the present disclosure.
Figure 4:
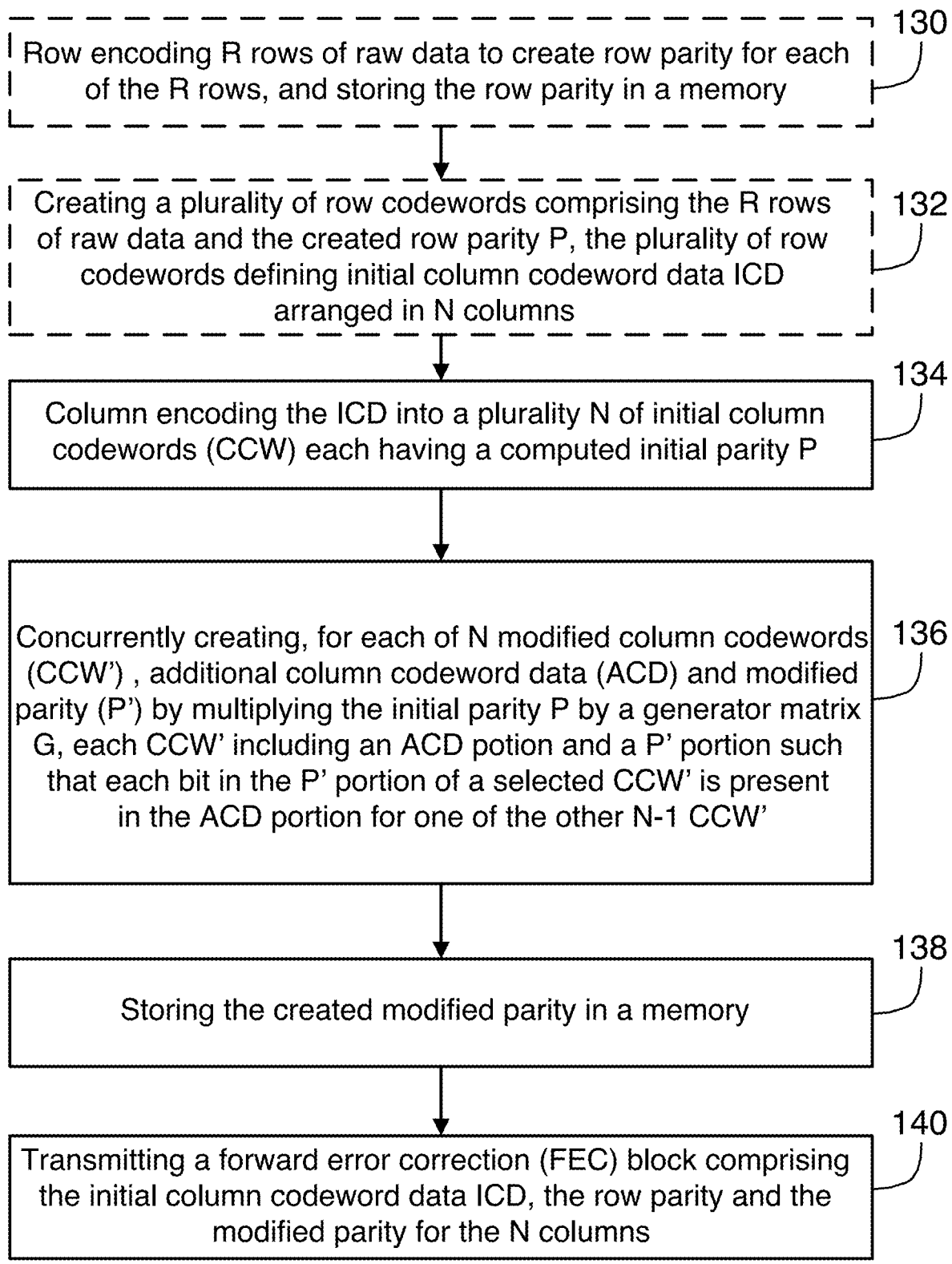
FIG. 4 is a flowchart illustrating a processor-implemented method of data encoding by creating modified parity according to an embodiment of the present disclosure.

FIG. 3 illustrates row and column codeword encoding using modified parity P' according to an embodiment of the present disclosure, for example using modified column parity. FIG. 4 illustrates a related method of data encoding using modified parity according to an embodiment of the present disclosure. In an example embodiment, a non-transitory computer-readable memory is provided storing statements and instructions for execution by a processor to perform a processor-implemented method of encoding data, such as shown in FIG. 4 and described herein.

In contrast to known approaches, embodiments of the present disclosure concurrently create additional column data and modified column parity such that, using the combination of row data, row parity, and modified column parity, all data and parity bits are present in two codewords while using only two types of codewords, and without using extra parity-on-parity bits or codewords. For example, as will be described in further detail below in relation to FIGS. 3 and 4, embodiments of the present disclosure substantially concurrently create, for each of N modified column codewords CCW', additional column codeword data ACD and modified parity P' by multiplying the initial parity P by a generator matrix G. Each CCW includes an ACD portion and a P' portion such that each bit in the P' portion of a selected CCW' is present in the ACD portion for one of the other N−1 CCW'.

Without the need of extra parity-on-parity bits, embodiments of the present disclosure reduce or eliminate one or more of the following characteristics associated with POP: the wasted parity space and lower code rate; the drawback of single coverage of the POP bits; and the higher implementation complexity of working with 3 different types of codewords.

Referring to FIGS. 3 and 4, there are only two types of codewords used: row codewords and modified column codewords. As in the approach in FIG. 1, and as shown in 130 in FIG. 4, for each of R rows in the raw data, the row data 10 is encoded resulting in computed row parity 12. The row encoding can be described as a primary encoding. The row parity 12 is stored in a memory, such as a parity memory.

A row codeword 14, such as created in 132 in FIG. 4, includes the row data 10 and the corresponding computed row parity 12. The plurality of row codewords define input data, or initial column codeword data ICD arranged in N columns.

In an embodiment, 130 and 132 are omitted and replaced by a single step of storing, in a memory in a first memory state, a plurality R of row codewords comprising R rows of raw data and created row parity, the plurality of row codewords defining initial column codeword data ICD arranged in N columns. In such an embodiment, the row codewords were previously generated or computed. In an alternate embodiment, the ICD is raw data to be encoded for the first time by the column encoding.

At 134, the ICD 20 is column encoded into a plurality N of initial column codewords CCW, each having a computed initial parity P, as in known approaches.

As shown at 136 in FIG. 4, according to an embodiment of the present disclosure, the method comprises substantially concurrently creating, for each of N modified column codewords CCW', additional column codeword data ACD and modified parity P' by multiplying the initial parity P by a generator matrix G. Each CCW' includes an ACD portion and a P' portion such that each bit in the P' portion of a selected CCW' is present in the ACD portion for one of the other N−1 CCW'. In an example embodiment, the method comprises, for each of the N columns, concurrently creating and storing in the memory, in a second memory state, additional column codeword data ACD and modified parity P' such that each bit in the P' portion for a selected column is present in the ACD portion for one of the other N−1 columns.

As shown in 138 in FIG. 4, the created modified parity for the N columns is stored in a memory, for example in a modified parity memory. As shown in 140 in FIG. 4, the processor-implemented method concludes by transmitting a forward error correction (FEC) block, the FEC block comprising the plurality of row codewords and the modified parity for the N columns.

As described above, each bit in the P' portion for a selected CCW' is present in the ACD portion for one of the other N−1 CCW', such that each bit in the set of P' bits is double-covered in the set of ACD bits. Consider that the P' portions for all N columns together form a set of modified parity bits {P1', ..., PN'}, and that the ACD portion for all N columns together form a set of ACD bits {$ACD_1$, ..., $ACD_N$}. In such a scenario, all of the modified parity bits are present in the set of ACD bits {$ACD_1$, ..., $ACD_N$}.

In another embodiment, the present disclosure provides a non-transitory computer-readable memory storing statements and instructions for execution by a processor to perform a method of encoding data, similar to the method in FIG. 4, but omitting 130 and 132. In such an example embodiment, the processor-implemented method comprises: obtaining initial codeword data ICD; encoding the ICD into a plurality N of initial codewords (CW), each of the plurality N of initial codewords having a portion of the ICD and having a computed initial parity P; concurrently creating, for each of the N modified codewords (CW), additional codeword data (ACD) and modified parity (P') by multiplying the initial parity P by a generator matrix G, each CW including an ACD portion and a P' portion such that each bit in the P' portion of for a selected CW is present in the ACD portion for one of the other N−1 CW; storing the modified parity P' for the N modified codewords in a modified parity memory; and transmitting a forward error correction (FEC) block, the FEC block comprising the ACD and the modified parity P' for the N modified codewords.

Figure 5:
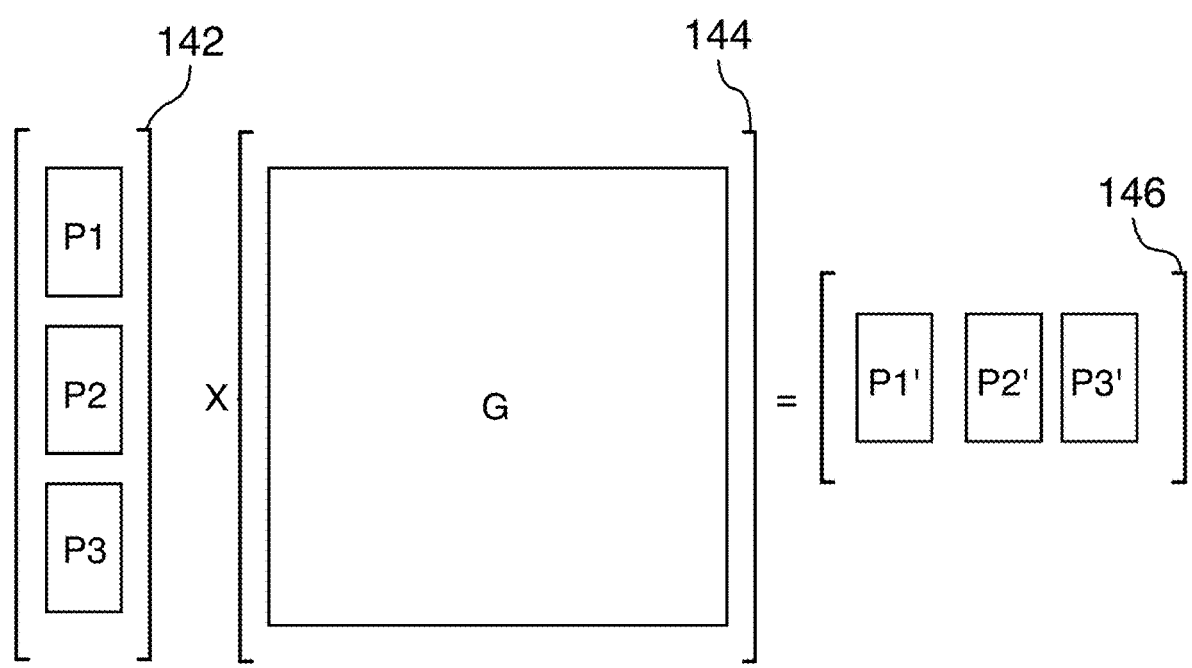
FIG. 5 illustrates multiplying a matrix of computed initial parity by a generator matrix to create a matrix of modified parity.

FIG. 5 illustrates multiplying a matrix of computed initial parity by a generator matrix to create a matrix of modified parity. In an example embodiment, a conversion equation from Pn to Pn' can be expressed for N=3 as follows:

$$\begin{bmatrix} P1 \\ P2 \\ P3 \end{bmatrix} * G = \begin{bmatrix} P1' & P2' & P3' \end{bmatrix}$$

This conversion equation is also illustrated visually in FIG. 5, which illustrates multiplying a matrix 142 of computed initial parity by a generator matrix 144 to create a matrix 146 of modified parity. As described earlier with respect to the computed initial parity P1, an initial parity matrix 142 is a matrix comprising a set of initial parity bits for a plurality N of columns, e.g. {P1, ..., PN}, where N is a positive integer. In an example embodiment in which "B" represents the bit size of one set of initial parity P, e.g. the size of P1, the initial parity matrix 142 as shown in FIG. 5 is 1×(N*B), or 1×(3*B) for N=3. In an example embodiment, a modified column codeword CCW' is generated based on the initial parity P, for example by multiplying the initial parity matrix 142 by a generator matrix G 144, for example of size (N*B)×(N*B).

In an example embodiment, P1 is m*T, where m is the field size of the BCH and T is correction capacity. In an example in which m=9, T=4 and N=3: P1 (and P2 and P3) are each 36 bits; G is 108×108 (N*m*T×N*m*T); P1' (and P2' and P3') are each 36 bits; and [P1' P2' P3']=[(P11',P12') (P21' P22') (P31' P32')].

FIG. 5 also illustrates how the multiplication of the initial parity matrix 142 by the generator matrix 144, of size 3*B×3*B, results in creation of the modified parity matrix 146, which comprises the modified parity bits for all N columns together to form a set of modified parity bits {P1', ..., PN'}. In an example embodiment, the modified parity matrix is (N*B)×1, or (3*B)×1 as shown in FIG. 5. The aspects illustrated in FIG. 5 are part of the step of concurrently creating, for each of the N modified column codewords CCW', additional codeword data ACD and modified parity P' by multiplying the initial parity P by a generator matrix G, each CCW' including an ACD portion and a P' portion such that each bit in the P' portion of for a selected CCW' is present in the ACD portion for one of the other N−1 CCW'.

Figure 6:
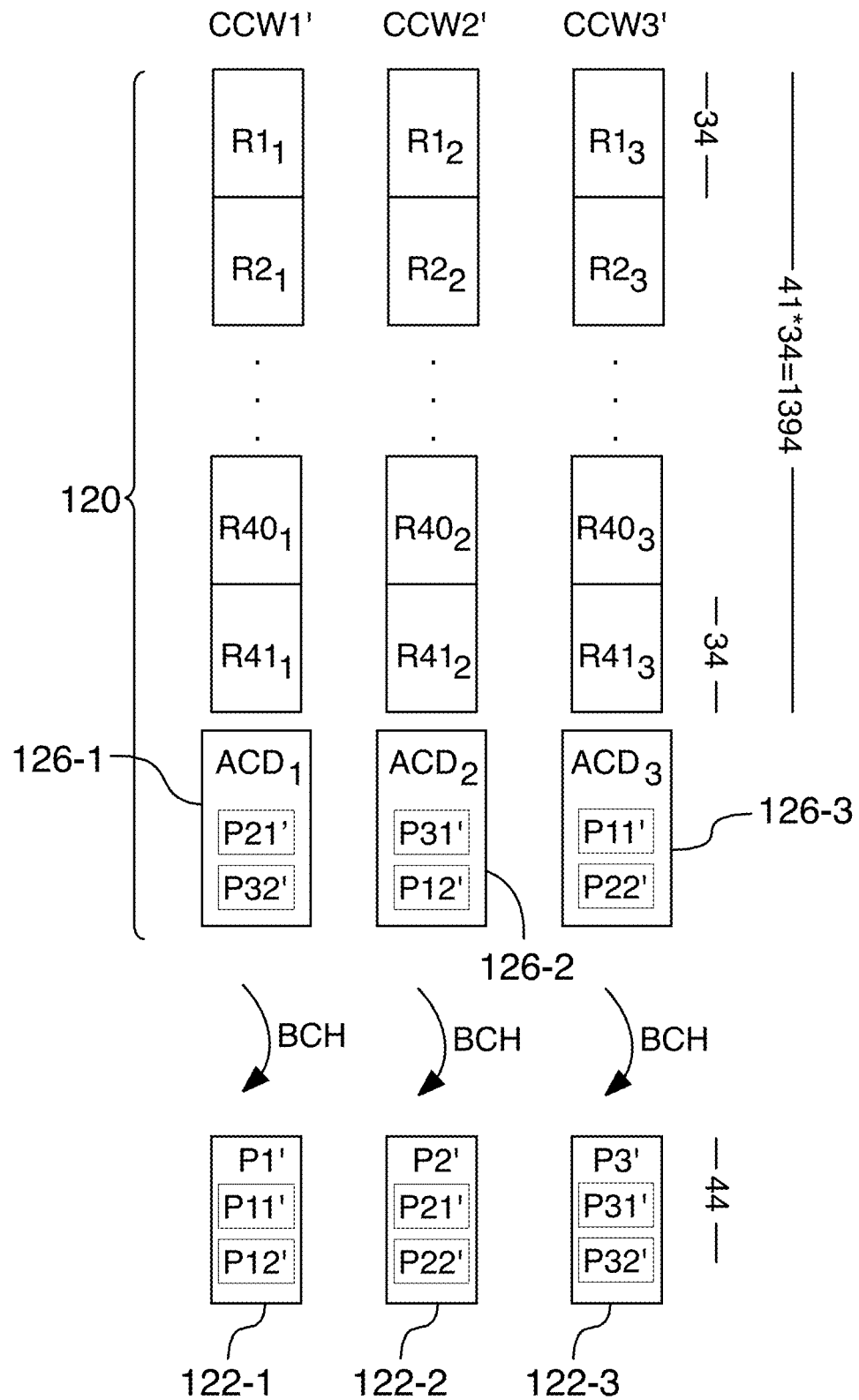
FIG. 6 illustrates relationships between three modified column codewords, additional column data and modified parity, including an equivalent data encoding relationship, according to an embodiment of the present disclosure.

FIG. 6 illustrates relationships between three modified column codewords, additional column data and modified parity, including an equivalent data encoding relationship, according to an embodiment of the present disclosure. As described earlier in relation to the embodiment of FIG. 4, in a first step, column encoding is performed as per known approaches, such as using standard BCH encoding of the ICD; the generated BCH parity, or initial parity P, is the same as known approaches. In a second step according to an embodiment of the present disclosure, the initial parity P is multiplied by the inverted parity connection matrix, or generator matrix G, thereby creating P'. This action simultaneously places all the ACD bits in their correct locations in the CCW' and creates all the bits for P', enabling creation of the N instances of CCW'. Multiplication by G creates P' column codeword parity values such that the Pn' values are the same as the BCH encoding of all of the ICD (row data) and the indicated ACD data (126-1, 126-2, 126-3). The placement of 1s and 0s in the parity connection matrix are selected specifically to enforce BCH, or other, encoding.

A property of the concurrent generation of the ACD and the P' is as follows. In a first scenario, after encoding the ICD to create the initial parity P, when multiplying the initial parity P (from each initial CCW) by the inverted parity connection matrix or generator matrix G, the result is the simultaneous generation of P' and ACD to create each CCW'. In a second scenario, if standard column encoding were to be performed on 120 (ICD+ACD) for each column, as shown in the equivalent encoding in FIG. 6, the result would be P', the same result as multiplying P by G in the first scenario. However, in implementation it is practically impossible to perform the column encoding of the second scenario, since you need to know the ACD values before encoding them, but the ACD values are calculated based on the P' values calculated as a result of the encoding, and would only be known after the encoding.

Therefore, embodiments of the present disclosure include the concurrent generation of the ACD and the P' using the generator matrix, or inverted parity connection matrix, making it practical to achieve using the first scenario what would theoretically be possible in the second scenario. While FIG. 6 primarily illustrates the composition of the modified column codewords CCW', it also shows that if the input data 120 (including the ICD, as well as ACD 126-1, 126-2 and 126-3) were to be BCH encoded, the result would be the illustrated P' values.

The example in FIG. 6, similar to FIG. 2, includes 41 rows of data, and 3 columns, each having a column codeword. The first column codeword CCW1' includes ICD comprising first components $R1_1$, $R21$, . . . , $R41_1$ from each of rows 1-41, plus additional codeword data $ACD_1$ 126. The $ACD_1$ 126-1 and the modified parity P1' 122-1 are substantially concurrently created such that each bit in P1' is present in the ACD for one of the other N−1 columns.

In other words, each bit in P1' is present in $ACD_2$ or $ACD_3$. In an example embodiment as shown in FIG. 6 in which P1' has two equally sized portions P11' and P12', the first portion P11' of P1' is present in $ACD_3$, and the second portion P12' of P2' is present in $ACD_2$. Similarly, P21' is present in $ACD_1$, and P22' is present in $ACD_3$. Finally, P31' is present in $ACD_2$, and P32' is present in $ACD_1$.

As shown in the example embodiment of FIG. 6, each bit of P1', P2' and P3' is present in either $ACD_1$, $ACD_2$ or $ACD_3$, providing the "double-coverage" of those bits in CCW1', CCW2' and CCW3'. Also as shown in FIG. 6, each bit of P1' is only present once in either $ACD_2$ or $ACD_3$. The same applies for each bit of P2' and each bit of P3'. In such an example embodiment, each of the P' bits in the set is present only once in the set $\{ACD_1, \ldots, ACD_N\}$.

FIG. 6 also shows that modified parity bits P1' now take part in two modified codewords, for example two BCH equations. All of the bits of P1' are fully part of the first column codeword CCW1', but portions thereof are also part of each of the other column codewords CCW2' and CCW3'. This is also true for P2' and P3' created according to an embodiment of the present disclosure.

Encoding these 3 codewords, including generating parities P1', P2' and P3', is not necessarily straightforward; any single codeword cannot be encoded without completing the others, since they all depend on each other. This is a reason why the ACD and the P' are substantially concurrently created using a parity connection matrix and the generator matrix.

Figure 7:
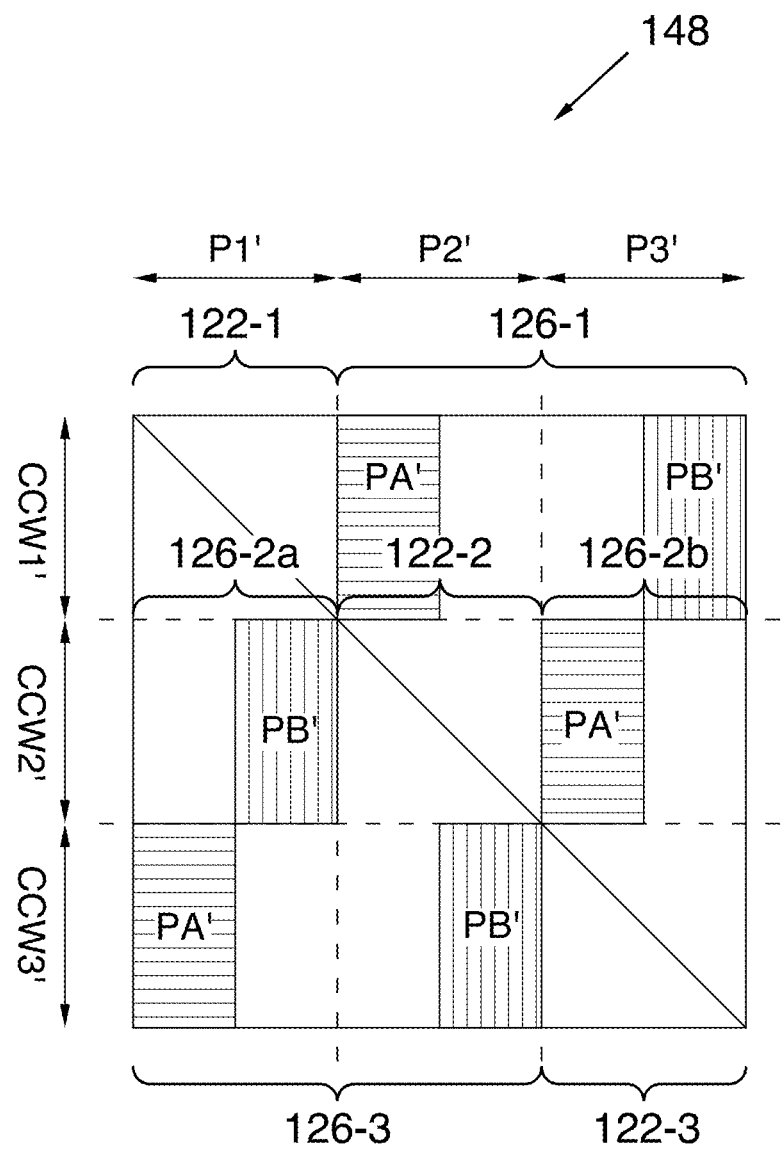
FIG. 7 illustrates a block representation of a parity connection matrix representing relationships between the three modified column codewords in FIG. 6 and the computed modified parity and additional column data according to an embodiment of the present disclosure.

FIG. 7 illustrates a block representation of a parity connection matrix 148 representing relationships between the 3 modified column codewords CCW1', CCW2' and CCW3' and the modified parity P1', P2' and P3', as well as the ACD, according to an embodiment of the present disclosure. The diagonal line represents the connection between initial parity P and corresponding modified parity P', while the rectangular boxes define the ACD connections. The diagonal line is a shorthand representation to indicate that the column codeword of the selected row in the matrix includes all of the portions of the rows of data for that particular column, as well as the entire indicated section of modified parity. For example, CCW1' comprises $R1_1$, . . . , $R41_1$ (as initial column codeword data, or ICD, included in what is represented by the diagonal line in row 1 column 1); all of P1' (as modified parity for column 1, see 122-1); and the first half of P2' and the second half of P3' (as ACD for column 1, see 126-1). Similarly, CCW2' comprises $R1_2$, . . . , $R41_2$ (as ICD for column 2, included in what is represented by the diagonal line in row 2 column 2); all of P2' (as modified parity, see 122-2); and the second half of P1' and the first half of P3' (as ACD for column 2, see 126-2a and 126-2b). Finally, CCW3' comprises $R1_3$, . . . , $R41_3$ (as ICD for column 3, included in what is represented by the diagonal line in row 3 column 3); all of P3' (as modified parity for column 3, see 122-3); and the first half of P1' and the second half of P2' (as ACD for column 3, see 126-3).

In an example embodiment, each row in the parity connection matrix is a cyclically rotated version of an adjacent row. With respect to the values of P' in each of CCW as illustrated with respect to FIG. 7, the first half of each of P1', P2' and P3' has the same value of PA', where the value of PA' is a first group of modified parity bits. Similarly, the second half of each of P1', P2' and P3' has the same value PB', where the value of PB' is a second group of modified parity bits. In other words, with respect to FIG. 7, PA'=P11'=P21'=P31', and PB'=P12'=P22'=P32'.

In an example embodiment, concurrently creating the ACD and the P' for each of the N CCW' comprises deriving part of the ACD for a selected column based on contents of the P' for the remaining N−1 CCW. For example, part of $ACD_1$ is derived based on contents of P2' and on contents of P3'. In an example embodiment, concurrently creating the ACD and the P' for each of the N CCW' comprises deriving the entire ACD for a selected CCW based on contents of the P' from each of the remaining N−1 CCW'. For example, the entire ACD, is derived based on contents of P2' and P3'.

Figure 8:
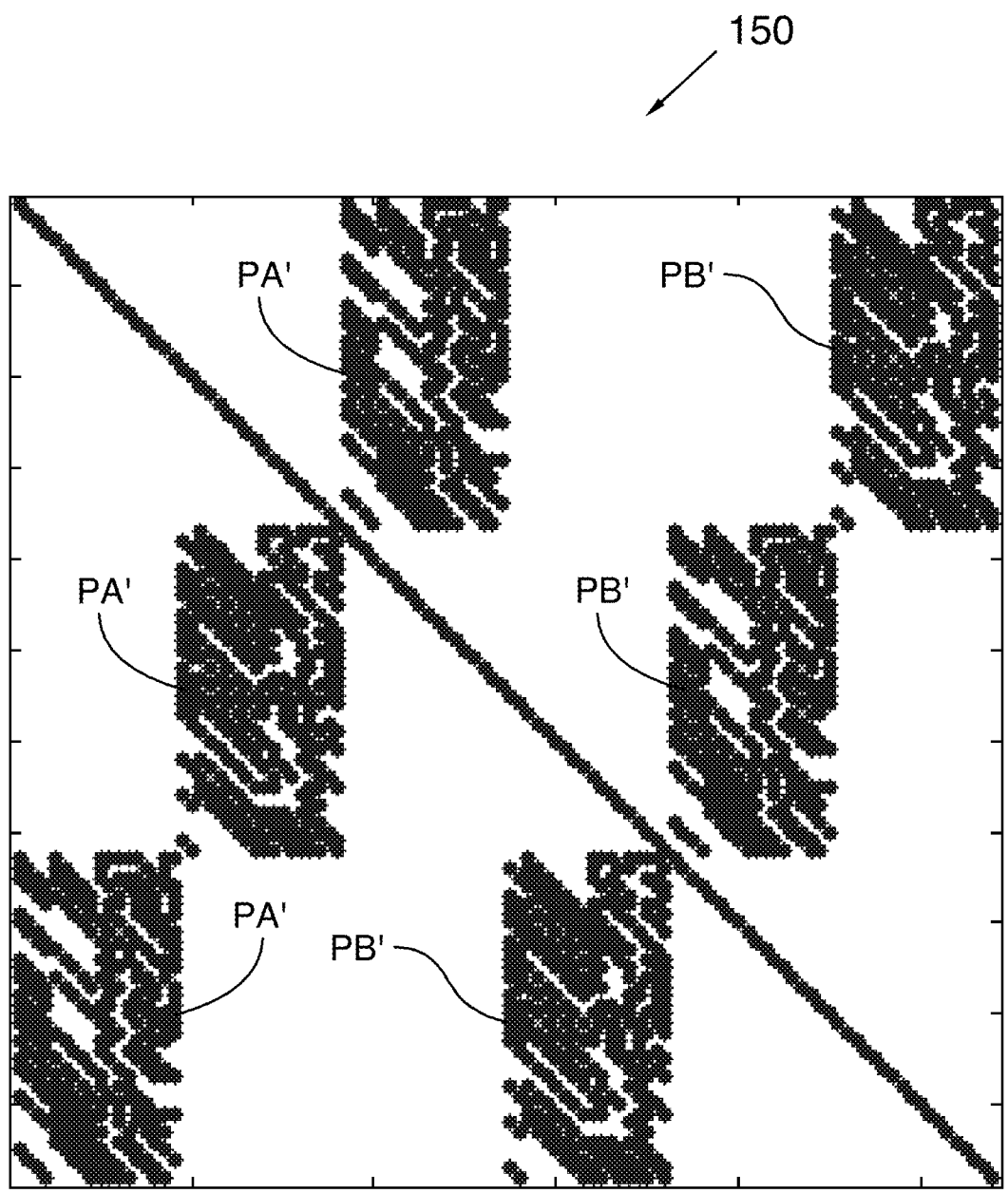
FIG. 8 illustrates a parity connection matrix showing connections based on the parity connection matrix of FIG. 7 according to an embodiment of the present disclosure.

FIG. 8 illustrates a parity connection matrix 150 showing connections based on the parity connection matrix 148 of FIG. 7 according to an embodiment of the present disclosure. Similar to FIG. 7, in FIG. 8 the diagonal line represents the connection between initial parity P and corresponding modified parity P', while the rectangular boxes define the ACD connections. For example, the diagonal line is a shorthand representation to indicate that the column codeword of the selected row in the matrix includes all of the portions of the rows of data for that particular column, as well as the entire indicated section of modified parity. The parity connection matrix in FIG. 8, similar to FIG. 7, comprises a plurality of cyclically symmetrical rows such that each row of the parity connection matrix is a cyclically rotated version of an adjacent row. In an example embodiment, the cyclical rotation amount is m*T, so that CCW1' is cyclically rotated to the right by m*T(c−1) bits, where c is the CCW number at that row in the matrix (i.e. CCWc). In the parity connection matrix 150 of FIG. 8, the cyclical rotation is apparent when observing the identical connections provided in blocks PA' and PB' in each of their respective rows in the matrix.

In an example embodiment, computation of the parity connection matrix 150 is performed using standard BCH encoding practices. In a BCH code, each input data bit takes part in the generation of the encoded parity bits according to a standard BCH generator equation (1) below, known from the publication "Error Control Coding: Fundamentals and Applications" by S. Lin and D. Costello (Prentice-Hall, Inc., New Jersey, 2004). Equation 1 defines the connections from each input bit to the generated parity. Connections in GF2, where GF2 is the Galois field of two elements, indicate that a given input bit is XORed into the calculation of the BCH parity for that codeword $$g(X) = LCM\{Phi_i(X), Phi_3(X), \ldots Phi_{2t-1}(X)\}$$ Equation 1

The ACD connections that are used within the parity connection matrix are taken from (1).

Figure 9:
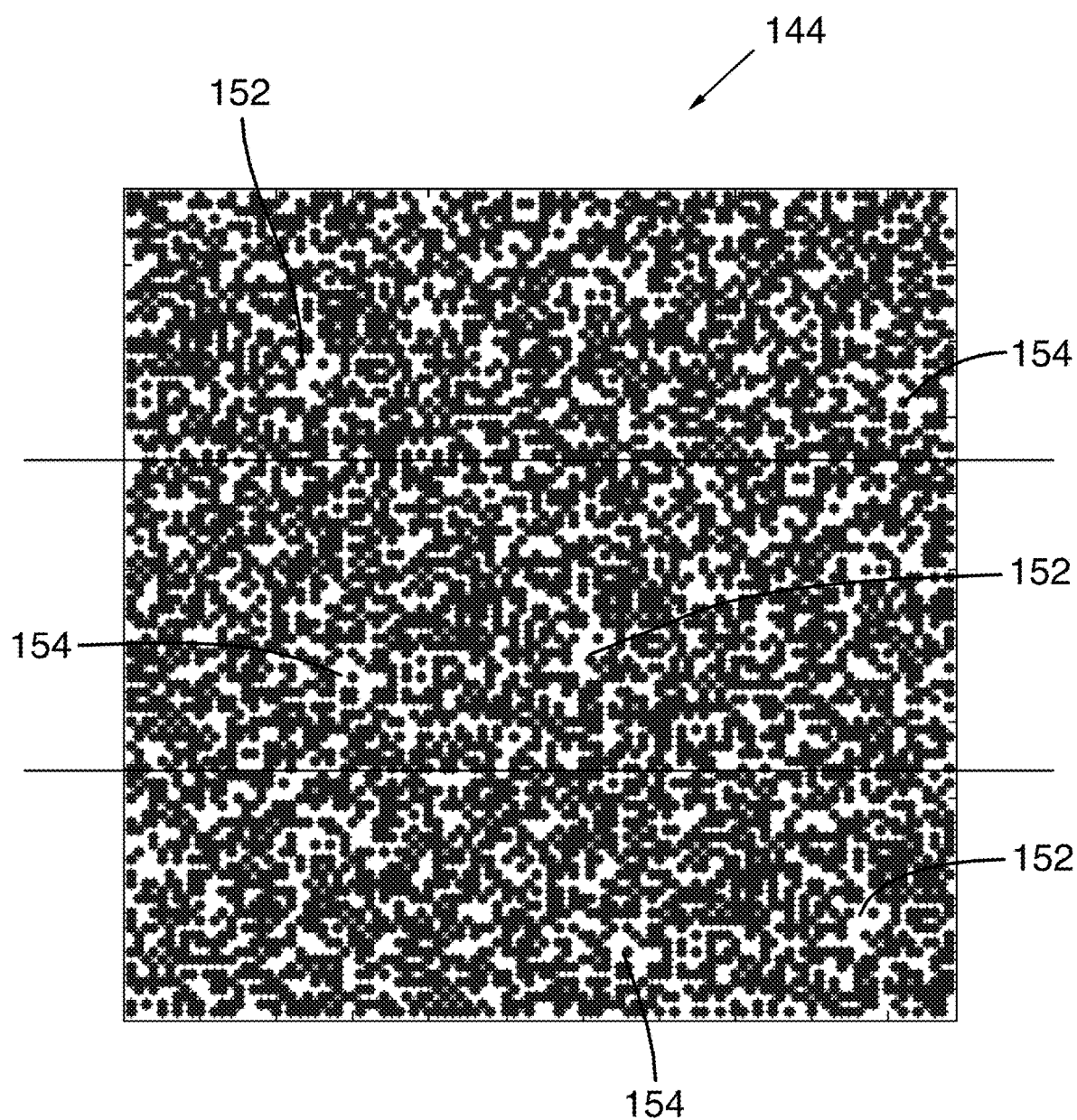
FIG. 9 illustrates a generator matrix, or a matrix inversion of the parity connection matrix of FIG. 8, according to an embodiment of the present disclosure.

FIG. 9 illustrates a generator matrix 144, or a matrix inversion of the parity connection matrix 150 of FIG. 8, according to an embodiment of the present disclosure. FIG. 9 is the matrix inversion of the parity connection matrix of FIG. 8, where the inversion is a Galois-field inversion. In an example embodiment, multiplying the initial parity P by the generator matrix 144 shown in FIG. 9 concurrently creates the modified parity P' and the ACD for each of the N columns. In an example embodiment, the present disclosure provides an encoder comprising a memory storing the generator matrix 144.

In an example embodiment, the generator matrix 144 such as in FIG. 9 comprises a plurality of cyclically symmetrical rows such that each row is a cyclically rotated version of an adjacent row. This is illustrated in FIG. 9 by identifying similar patterns 152 and 154 in each of 3 "rows" in the generator matrix. The generator matrix is also approximately 50% density (half zeroes and half ones) of effectively random 1s and 0s. In an example embodiment, the generator matrix is stored in a memory, such as a Read Only Memory (ROM). The cyclic rotation allows us to store only one row, along with an indication of how the row is cyclically rotated to produce the remaining rows. With such cyclical symmetry, in an embodiment an encoder storing a generator matrix of N rows and N columns only needs a memory of size 1/N, since only 1/N of the generator matrix need be stored, as the other N−1 rows are just cyclical rotations of an adjacent row.

In an alternate embodiment, the connections in the parity connection matrix 150 or the generator matrix 144 cause different portions of the modified parity to be provided in different orders than shown in FIG. 6, FIG. 7 and FIG. 8, but the connections remain in the same order in each row. For example, the structure or rule for row 1 is repeated and rotated, by exactly the size of one portion of the modified parity, for each other row.

In a further alternate embodiment, the connections in the parity connection matrix 150 or the generator matrix 144 cause the modified parity to be provided in a non-cyclically rotated pattern that causes each bit in the P' for a selected column is present in the ACD for one of the other N−1 columns. In such an embodiment, the generator matrix 144 does not exhibit the cyclical symmetry as with other embodiments, and the memory in which the generator matrix is to be stored must be at least the same size as the generator matrix.

In an example embodiment, the generator matrix defines connection relationships between P, P' as well as the ACD for each of the N columns, the connection relationships causing each bit in the P' for a selected column to be present in the ACD for one of the other N−1 columns.

Figure 10:
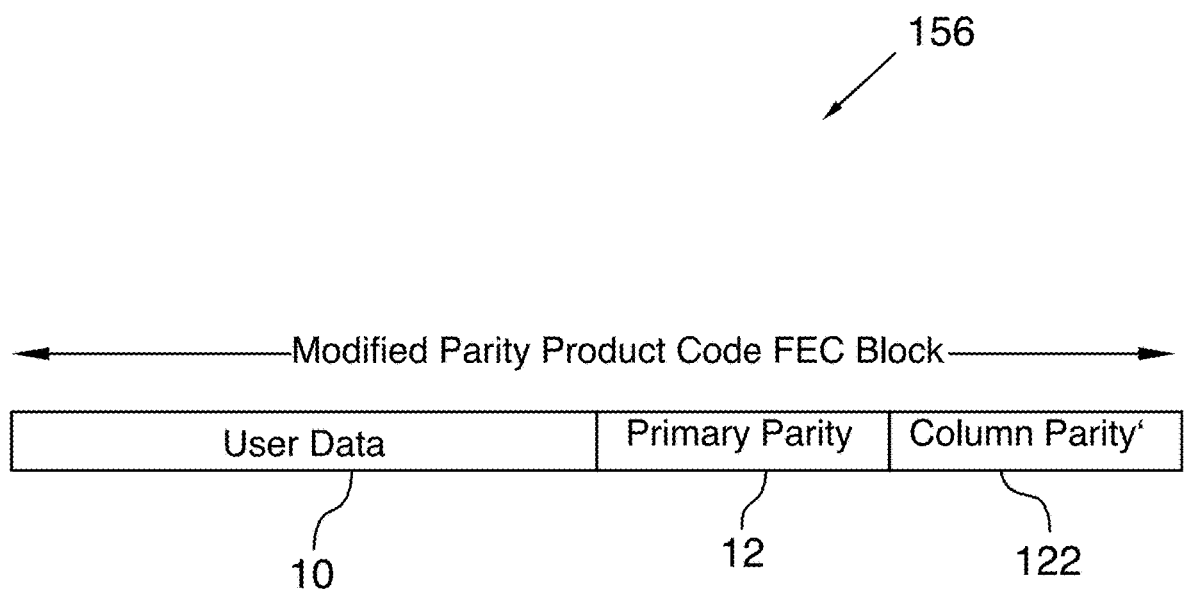
FIG. 10 illustrates a transmitted FEC block including modified parity according to an embodiment of the present disclosure.

FIG. 10 illustrates a transmitted FEC block 156 including modified column parity P' 122 according to an embodiment of the present disclosure. As described earlier, a processor-implemented method of encoding in an embodiment includes transmitting a FEC block comprising the row codewords (e.g. the user data 10 and the primary parity 12) and the modified parity P' for the N columns. In other words, the transmitted FEC block 156 includes all of the original data together with all of the computed parity values (row parity and modified column parity). A receiver receiving the FEC block 156 is configured to arrange the received data into row and column codewords and also to consider the placement of ACD values within the column codewords.

The example embodiments as described and illustrated in relation to FIG. 3 through FIG. 9 completely avoid generating parity-on-parity (POP) as in known approaches, and avoids having parity bits that are covered in only one codeword. In an example embodiment, a high level code structure leverages a minimum number of generator matrices G while still supporting a full range of code rates. To support code rate flexibility, in an embodiment an encoder stores several generator matrices G. In an embodiment, each generator matrix G can be re-used at different code rates.

In some specific implementations, due to mathematical properties of matrices, the parity connection matrix of FIG. 8 does not invert properly. In such cases, in an example embodiment, a forced zero is added before one of the portions of P' to move each bit over by 1 spot, to make the matrix invertible. In an implementation, several such shifts may be required to obtain an invertible matrix. Such shifting becomes a property of the codeword and must be replicated at the receiver to enable decoding.

While FIGS. 3-9 have been described in relation to embodiments comprising 3 codewords, other embodiments of the present disclosure are adapted to provide different numbers of codewords. For example, to generalize the computation of ACD values and the number of bits in P':

Equation 2 for r=1...R -- r is the CCW number
    for m=1...R-1 -- There are R-1 ACD sub-portions
        ACD(r,m) = P'(r%R+1,m)
    end
end In an embodiment, P' is divided into R−1 equal sections where each section has b=m*T/(R−1). If b is not an integer then, as described above, zeros are padded to the end of P' so that pad=ceiling(m*T/(R−1))−m*T/(R−1) zeroes are added to the end of P'. Total bits in P' is then m*T+pad.

Figure 11:
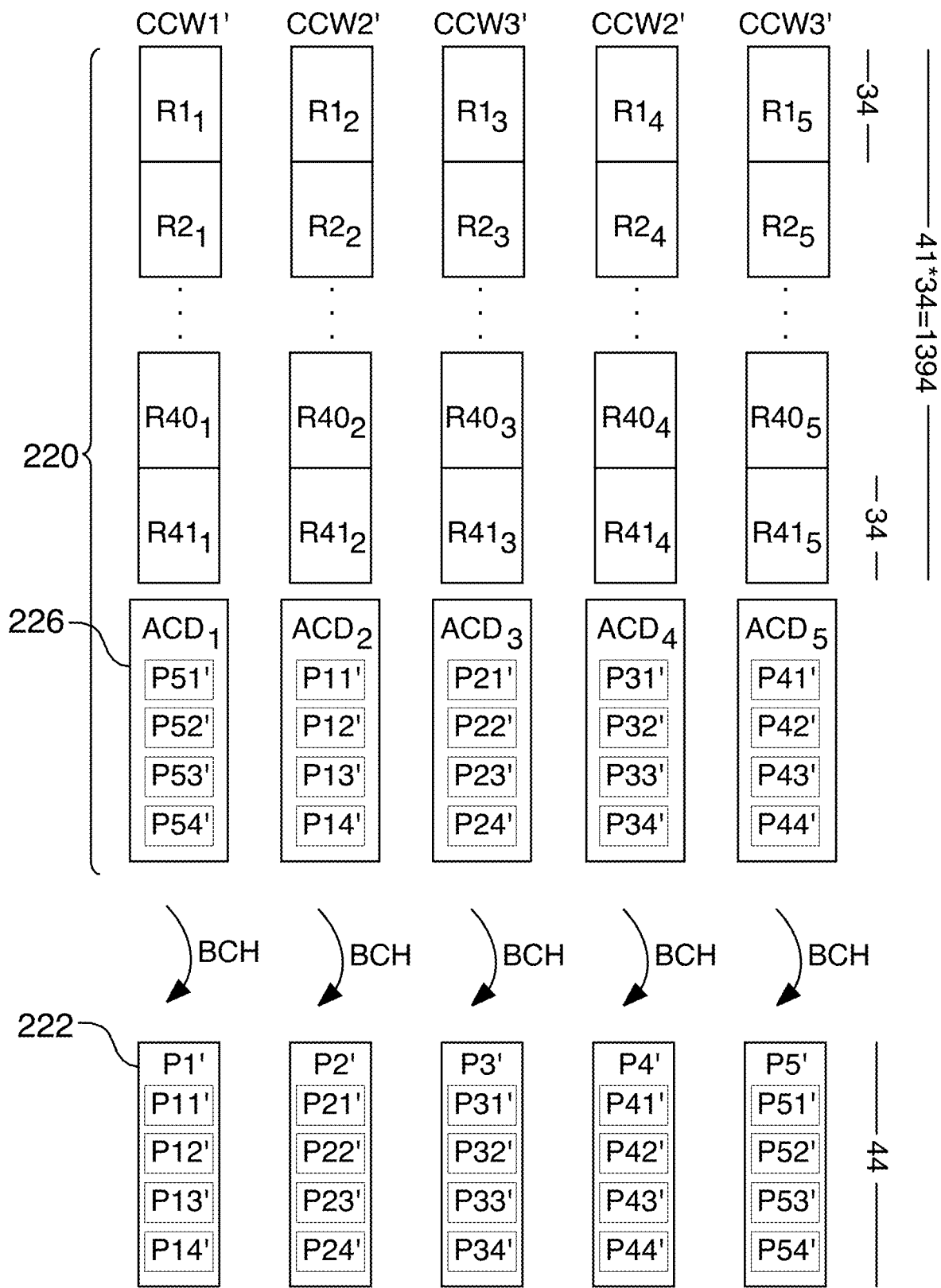
FIG. 11 illustrates relationships between five modified column codewords, additional column data and modified parity, including an equivalent data encoding relationship, according to another embodiment of the present disclosure.
Figure 12:
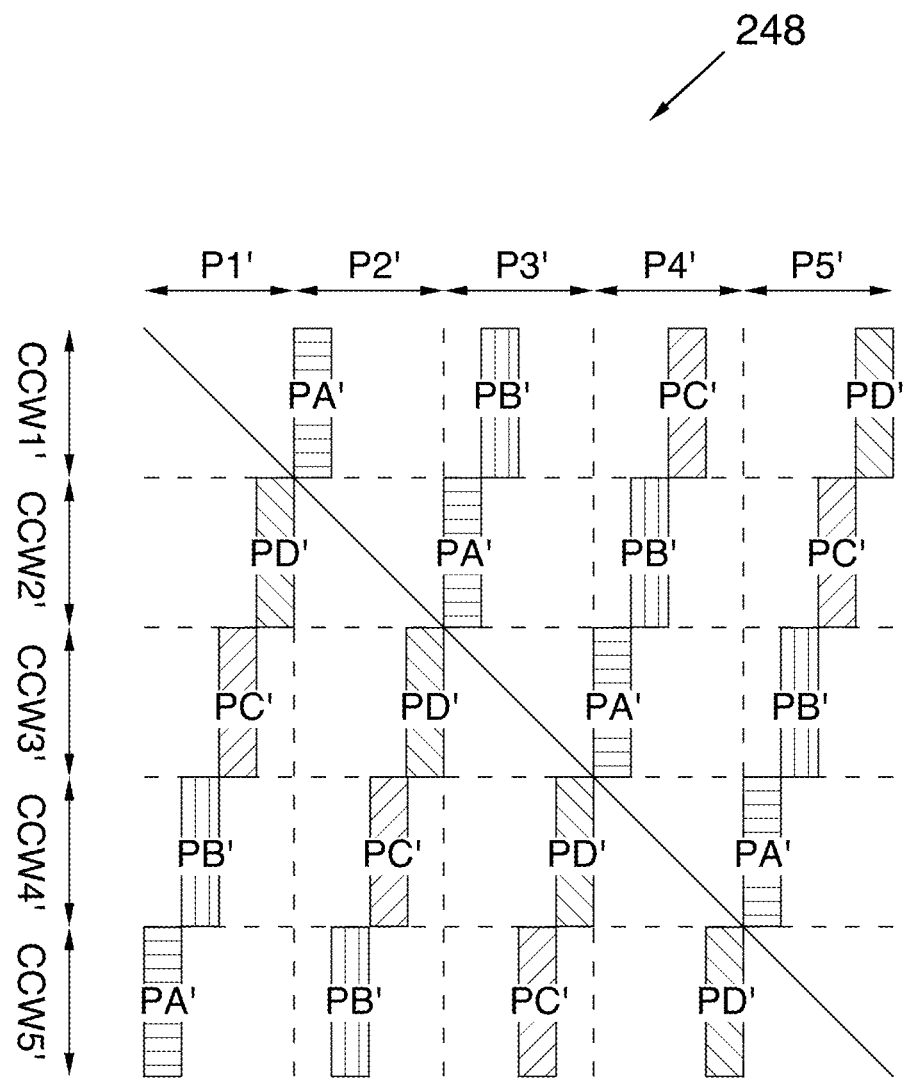
FIG. 12 illustrates a block representation of a parity connection matrix representing relationships between the five column codewords in FIG. 11 and the computed modified parity and additional column data according to an embodiment of the present disclosure.

In another example implementation using R=5, FIG. 11 illustrates relationships between five modified column codewords, additional column data and modified parity, including an equivalent data encoding relationship. FIG. 11 is similar to FIG. 6, for an embodiment with 5 codewords instead of 3 codewords, and the content thereof can be understood by one of ordinary skill in the art based on the description of FIG. 6 and the application of Equation 2. FIG. 12 illustrates a block representation 248 of a parity connection matrix representing relationships between the five column codewords in FIG. 11 and the computed P' and ACD according to an embodiment of the present disclosure. In FIG. 12, similar to FIG. 7, each row is a cyclically rotated version of an adjacent row, and the values PA', PB', PC' and PD' are cyclically rotated according to the representation in FIG. 12 to produce the ACD and P' values as shown in FIG. 11.

In an embodiment, the present disclosure provides an encoder comprising: a processor; a parity memory in communication with the processor; a first encoder memory storing a generator matrix; and a second encoder memory, in communication with the parity memory and the first encoder memory and the processor. The second encoder memory stores statements and instructions for execution by the processor to perform a method of encoding data. The method comprises: storing, in the parity memory in a first memory state, a plurality R of row codewords comprising R rows of raw data and created row parity, the plurality of row codewords defining initial column codeword data ICD arranged in N columns; column encoding the initial column data ICD into a plurality N of initial column codewords, and storing, in the parity memory in a second memory state, the plurality N of initial column codewords, each of the plurality N of initial column codewords having a portion of the ICD and having a computed initial parity P; concurrently creating for each of the N modified column codewords (CCW'), additional column codeword data (ACD) and modified parity (P') by multiplying the initial parity P by a generator matrix G, each CCW' including an ACD portion and a P' portion such that each bit in the P' portion for a selected CCW' is present in the ACD portion for one of the other N−1 CCW'; storing, in the parity memory in a third memory state, the ACD and the P' for each CCW'; storing, in the parity memory in a fourth memory state, the modified parity P' for the N columns; and transmitting a forward error correction (FEC) block, the FEC block comprising the plurality of row codewords and the modified parity P' for the N columns stored in the parity memory in the fourth memory state.

In an example embodiment, the generator matrix stored in first encoder memory in the encoder defines connection relationships between the initial parity P and the modified parity P' and the ACD for each of the N columns, the connection relationships causing each bit in the P' for a selected CCW' to be present in the ACD for one of the other N−1 CCW. In an example embodiment, the generator matrix comprises a plurality of cyclically symmetrical rows such that each row of the generator matrix is a cyclically rotated version of an adjacent row. In an example embodiment, the third memory stores one row of the cyclically symmetrical generator matrix, and the size of the third memory is equal to the size of one row of the generator matrix.

In the preceding description, for purposes of explanation, numerous details are set forth in order to provide a thorough understanding of the embodiments. However, it will be apparent to one skilled in the art that these specific details are not required. In other instances, well-known electrical structures and circuits are shown in block diagram form in order not to obscure the understanding. For example, specific details are not provided as to whether the embodiments described herein are implemented as a software routine, hardware circuit, firmware, or a combination thereof.

The above-described embodiments are intended to be examples only. Alterations, modifications and variations can be effected to the particular embodiments by those of skill in the art without departing from the scope, which is defined solely by the claims appended hereto.

What is claimed is:

1. An encoder comprising:
a processor;
a parity memory in communication with the processor;
a first encoder memory storing a generator matrix; and
a second encoder memory, in communication with the parity memory and the first encoder memory and the processor, the second encoder memory storing statements and instructions for execution by the processor to perform a method of encoding data, the method comprising:
storing, in the parity memory in a first memory state, a plurality R of row codewords comprising R rows of raw data and created row parity, the plurality of row codewords defining initial column codeword data ICD arranged in N columns;
column encoding the initial column data ICD into a plurality N of initial column codewords, and storing, in the parity memory in a second memory state, the plurality N of initial column codewords, each of the plurality N of initial column codewords having a portion of the ICD and having a computed initial parity P;
concurrently creating for each of the N modified column codewords (CCW'), additional column codeword data (ACD) and modified parity (P') by multiplying the initial parity P by a generator matrix G, each CCW' including an ACD portion and a P' portion such that each bit in the P' portion for a selected CCW' is present in the ACD portion for one of the other N−1 CCW';
storing, in the parity memory in a third memory state, the ACD and the P' for each CCW';
storing, in the parity memory in a fourth memory state, the modified parity P' for the N columns; and
transmitting a forward error correction (FEC) block, the FEC block comprising the plurality of row codewords and the modified parity P' for the N columns stored in the parity memory in the fourth memory state.

2. The encoder of claim 1 wherein the generator matrix defines connection relationships between the initial parity P and the modified parity P' and the ACD for each of the N columns, the connection relationships causing each bit in P' for a selected CCW' to be present in the ACD for one of the other N−1 CCW'.

3. The encoder of claim 1 wherein the generator matrix comprises a plurality of cyclically symmetrical rows such that each row of the generator matrix is a cyclically rotated version of an adjacent row.

4. The encoder of claim 1 wherein an N×N generator matrix is stored in 1/N of the space by storing content of only one row and an indication of how each row is a cyclically rotated version of the stored row.

5. A non-transitory computer-readable memory storing statements and instructions for execution by a processor to perform a method of encoding data, the processor-implemented method comprising:
  row encoding R rows of raw data to create row parity for each of the R rows, and storing the row parity in a memory;
  creating a plurality R of row codewords comprising the R rows of raw data and the created row parity, the plurality of row codewords defining initial column codeword data (ICD) arranged in N columns;
  column encoding the initial column data ICD into a plurality N of initial column codewords, each of the plurality N of initial column codewords having a portion of the ICD and having a computed initial parity P;
  concurrently creating, for each of N modified column codewords (CCW'), additional column codeword data (ACD) and modified parity (P') by multiplying the initial parity P by a generator matrix G, each CCW' including an ACD portion and a P' portion such that each bit in the P' portion of a selected CCW' is present in the ACD portion for one of the other N−1 CCW';
  storing the modified parity for the N columns in a modified parity memory; and
  transmitting a forward error correction (FEC) block, the FEC block comprising the plurality of row codewords and the modified parity for the N columns.

6. The non-transitory computer-readable memory of claim 5 wherein the P' portions for all N columns together form a set of modified parity bits $\{P1', \ldots, PN'\}$, wherein the ACD portions for all N columns together form a set of ACD $\{ACD_1, \ldots, ACD_N\}$, and wherein all of the modified parity bits $\{P1', \ldots, PN'\}$ are present in $\{ACD_1, \ldots, ACD_N\}$.

7. The non-transitory computer-readable memory of claim 6 wherein each of the modified parity bits in the set $\{P1', \ldots, PN'\}$ is present only once in the set $\{ACD_1, \ldots, ACD_N\}$.

8. The non-transitory computer-readable memory of claim 5 wherein, in the method, concurrently creating the ACD and the P' for each of the N CCW' comprises deriving part of the ACD portion for a selected CCW' based on contents of the P' portion from the remaining N−1 CCW'.

9. The non-transitory computer-readable memory of claim 8 wherein, in the method, concurrently creating the ACD and the P' for each of the N CCW' comprises deriving the entire ACD portion for a selected CCW based on contents of the P' from each of the remaining N−1 CCW'.

10. The non-transitory computer-readable memory of claim 5 wherein the generator matrix has a size N×N and wherein the method further comprises:
  generating an initial parity matrix having 1 column and N rows and including the computed initial parity P for the plurality N columns;
  creating the modified parity P' by multiplying the initial 1×N parity matrix by the generator matrix of size N×N, the modified parity provided in a modified parity matrix having N columns and 1 row.

11. The non-transitory computer-readable memory of claim 5 wherein the generator matrix defines connection relationships between the initial parity P and the modified parity P' and the ACD for each of the N columns, the connection relationships causing each bit in P' for a selected CCW' to be present in the ACD for one of the other N−1 CCW'.

12. The non-transitory computer-readable memory of claim 5 wherein the generator matrix comprises a plurality of cyclically symmetrical rows such that each row of the generator matrix is a cyclically rotated version of an adjacent row.

13. The non-transitory computer-readable memory of claim 5 wherein an N×N generator matrix is stored in 1/N of the space by storing content of only one row and an indication of how each row is a cyclically rotated version of the stored row.

14. A non-transitory computer-readable memory storing statements and instructions for execution by a processor to perform a method of encoding data, the processor-implemented method comprising:
  obtaining initial codeword data ICD;
  encoding the ICD into a plurality N of initial codewords (CW), each of the plurality N of initial codewords having a portion of the ICD and having a computed initial parity P;
  creating a plurality N of modified codewords (CW') by multiplying the initial parity P by a generator matrix G to concurrently create, for each of the N modified codewords, additional codeword data (ACD) and modified parity (P') such that each bit in the P' for a selected CW' is present in the ACD for one of the other N−1 CW';
  storing the modified parity for the N modified codewords in a modified parity memory; and
  transmitting a forward error correction (FEC) block, the FEC block comprising the ICD and the modified parity for the N modified codewords.

15. The non-transitory computer-readable memory of claim 14 wherein the P' portions for all N columns together form a set of modified parity bits $\{P1', \ldots, PN'\}$, wherein the ICD portions for all N columns together form a set of ICD $\{ICD_1, \ldots, ICD_N\}$, and wherein all of the modified parity bits $\{P1', \ldots, PN'\}$, are present in $\{ICD_1, \ldots, ICD_N\}$.

16. The non-transitory computer-readable memory of claim 14 wherein each of the modified parity bits in the set $\{P1', \ldots, PN'\}$, is present only once in the set $\{ICD_1, \ldots, ICD_N\}$.

17. The non-transitory computer-readable memory of claim 14 wherein the generator matrix comprises a plurality of cyclically symmetrical rows such that each row of the generator matrix is a cyclically rotated version of an adjacent row.

18. A processor-implemented method of encoding data, comprising:
  storing, in a memory in a first memory state, a plurality R of row codewords comprising R rows of raw data and created row parity, the plurality of row codewords defining initial column codeword data ICD arranged in N columns;
  column encoding the initial column data ICD into a plurality N of initial column codewords, and storing, in the memory in a second memory state, the plurality N of initial column codewords, each of the plurality N of initial column codewords having a portion of the ICD and having a computed initial parity P;
  concurrently creating for each of the N modified column codewords (CCW'), additional column codeword data (ACD) and modified parity (P') by multiplying the initial parity P by a generator matrix G, each CCW including an ACD portion and a P' portion such that each bit in the P' portion for a selected CCW' is present in the ACD portion for one of the other N−1 CCW';

storing, in the parity memory in a third memory state, the ACD and the P' for each CCW';

storing, in the parity memory in a fourth memory state, the modified parity P' for the N columns; and transmitting a forward error correction (FEC) block, the FEC block comprising the plurality of row codewords and the modified parity P' for the N columns stored in the parity memory in the fourth memory state.

19. The processor-implemented method of claim 18 wherein the P' portions for all N columns together form a set of modified parity bits $\{P1', \ldots, PN'\}$, wherein the ACD portions for all N columns together form a set of ACD $\{ACD_1, \ldots, ACD_N\}$, and wherein all of the modified parity bits $\{P1', \ldots, PN'\}$ are present in $\{ACD_1, \ldots, ACD_N\}$.

20. The processor-implemented method of claim 18 wherein the generator matrix comprises a plurality of cyclically symmetrical rows such that each row of the generator matrix is a cyclically rotated version of an adjacent row.

* * * * *